Dec. 6, 1960 R. F. STEWART 2,963,631

ARRANGEMENT FOR INCREASING HEAT DISSIPATION
IN SEMI-CONDUCTOR-DEVICE

Filed July 10, 1958

INVENTOR

Richard F. Stewart

BY Stevens, Davis, Miller & Mosher

ATTORNEYS

United States Patent Office 2,963,631
Patented Dec. 6, 1960

2,963,631

ARRANGEMENT FOR INCREASING HEAT DISSIPATION IN SEMI-CONDUCTOR-DEVICE

Richard F. Stewart, Dallas, Tex., assignor to Texas Instruments Incorporated, Dallas, Tex., a corporation of Delaware Filed July 10, 1958, Ser. No. 747,704

3 Claims. (Cl. 317—235)

This invention relates to an improved arrangement for mounting a junction transistor and more particularly to a unique technique for efficiently dissipating heat from a transistor member to a heat absorbing member and thus increasing power dissipation of the transistor unit.

It is known that the thermal operating characteristics of a junction transistor limit the range of use thereof and that if the operating temperature of a transistor unit becomes excessive, there is a definite possibility of failure. Many efforts have been made to increase the permissible operating temperatures for transistor devices, particularly in the case of power units. The most widely used technique involves using a heat sink in the form of a copper plate with one region of the transistor mounted directly onto the plate. Whereas this enables efficient heat transfer to the plate and ultimate dissipation to the chassis on which the plate is mounted, it is only satisfactory in a circuit arrangement that allows for the grounding of one terminal or region of the transistor. In cases requiring a non-grounded mounting of the transistor, it is customary to mount the transistor bar some distance from the plate on wires insulated from the plate and to encapsulate the transistor in a potting compound which has a favorable thermal coefficient. The heat dissipation in this instance, however, has not been great. Other proposed constructions for relieving the thermal problem generally include cumbersome insulating members for the transistor and its leads for special means to be secured to the can or casing of the completed transistor unit. In most instances, these other proposals are impractical.

The present invention for the first time provides an improved arrangement for dissipating heat in junction transistors used in non-grounded applications wherein the amount of heat dissipated is comparable to that obtained in a grounded application.

Essentially this is accomplished by the present invention by electrically insulating the transistor from its header without thermally insulating the transistor from the header. A copper plate is used as the header and is arranged with a plurality of leads which are retained in the header and insulated from it by glass beads sealed into the header. The insulation of the transistor can be accomplished in several ways, for instance, using a thin mica washer or by means of an insulating coating such as a "Teflon" coating. "Teflon" is a registered trademark by the du Pont Company of Wilmington, Delaware, and is used to designate a plastic consisting of a tetrafluoroethylene polymer.

Accordingly, it is an object of this invention to provide a novel technique for efficiently and expeditiously dissipating heat from a transistor in a non-grounded application.

Figure 1:
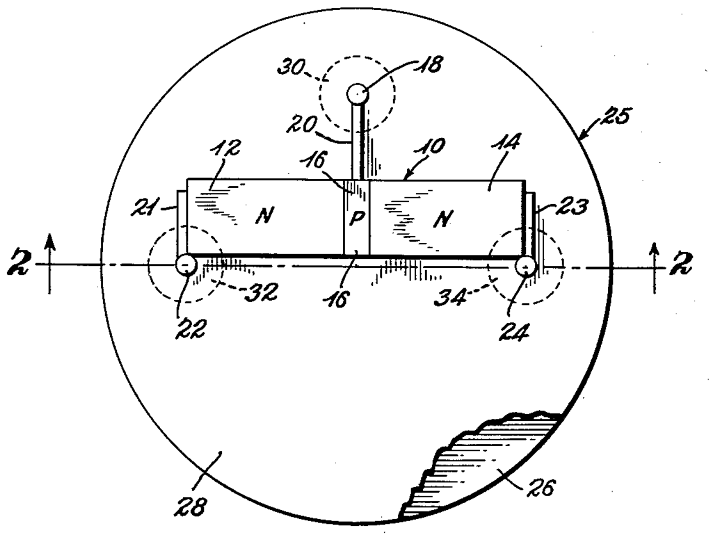
Figure 2:
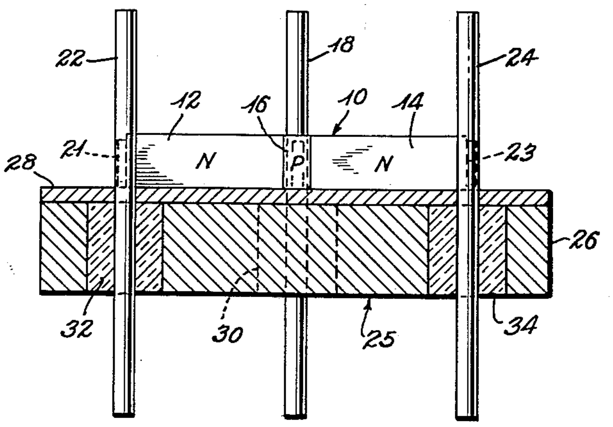

Other and further objects of the present invention will become more fully apparent from the following detailed description when taken in conjunction with the drawings, in which:

Figure 1 is a top plan view of a transistor device with parts broken away to show the inventive features; and Figure 2 is a vertical sectional view taken along lines 2—2 in Figure 1.

Referring now to the drawings, the novel transistor assembly embodied herein is illustrated and includes a semi-conductor device such as a junction transistor generally indicated at 10. The transistor 10 is shown as a grown junction type and is in the form of a bar. The transistor includes two end regions 12 and 14 of N-type conductivity separated within the body of the bar, by a region 16 of P-type conductivity. The regions 12, 14 are the emitter and collector respectively of the device and region 16 is the base.

Although a grown junction NPN transistor is specifically described it will be appreciated that the invention applies to all kinds of semi-conductor devices and materials including silicon, germanium, and others and to both NPN and PNP devices, as well as, all variations thereof such as PNIP, NPIN, PNPN and others.

The transistor 10 is mounted on a 3 pin header, generally designated by the numeral 25. The header consists of a copper plate 26 through which pass 3 pins, 18, 22, and 24. The pins are insulated from the copper plate 26 by means of glass or ceramic beads or inserts 30, 32, and 34. The transistor 10 is customarily provided with contacts to the ends of the emitter and collector regions. Essentially, the contacts consist of a coating or plating located on the end portions of the transistor bar in order to facilitate the attachment of leads or wires. With regard to the base region, a contact may or may not be used. It is usually desirable however, that the contacts which are applied to transistor bar be essentially of an ohmic nature. In the case of the base region, it is desirable, in view of the thinness of this region and the difficulty of avoiding overlap into the adjacent emitter and collector areas, that the contact be essentially ohmic with the base region and rectifying with the adjacent emitter and collector regions.

The bar 10 is mounted with its longitudinal axis parallel with the upper surface of the plate 26. A lead 20 is attached to the base region 16, in the manner previously described, and also is attached, by soldering or any other conventional means, to pin 18. Tabs 21 and 23 are attached to the contacts formed on the ends of the bar and also to the pins 22 and 24, respectively. These attachments may be made by soldering.

Although tabs are illustrated, it will be appreciated that other means may be employed, such as wires. Alternatively, the bar 10 can be dimensioned such that it will lie between and in line with the pins 22 and 24 with its ends close enough to them so that the contacts formed on the ends of the bar can be soldered directly to the pins 22 and 24. Whatever means is employed, the important consideration is that the bar 10 is located on the plate 26 such that the longitudinal axis of the bar is parallel to the upper surface or plane of the plate 26, or in other words, one of the side faces of the bar is parallel with the upper surface of the plate 26.

The plate 26 constitutes a header for the device and at the same time functions in the nature of a heat sink since it constitutes a substantial mass characterized by high thermal conductivity. Accordingly, plate 26 is adapted to receive and dissipate a fairly large amount of heat. This concept in and of itself is well known in transistor technology. Whereas copper has been specified for the material of header 26 it will be appreciated that the other materials may be employed provided they have a high thermal conductivity. Thus, for example, aluminum, brass and other like materials may be utilized for plate 26 without deviating from the spirit of the invention.

Positioned between the transistor bar 10 and the upper surface of the copper header or heat sink 26 is a thin sheet or washer 28 of insulating material such as mica. The transistor bar 10 is firmly mechanically secured next to the mica washer 10 by its attachment to pins 22 and 24. The transistor leads or terminals 18, 22 and 24 extend through the mica washer 28 but since it possesses electrically insulating properties there is no danger of shorting.

The insulating mica washer 28 is approximately .003 inch in thickness and defines a sufficient electrical insulation of the transistor bar 10 from the copper heat sink 26 against the maximum voltage which will be applied during the operation of the device. Even though affording complete and effective electrical insulation, the mica washer 28 is at the same time sufficiently thin so that it does not greatly inhibit heat transfer from transistor bar 10 to the copper heat sink 26.

As evidenced by the previous discussion the insulating washer 28 effectively electrically insulates the transistor bar 10 from the copper heat sink 26, yet readily permits the transfer and dissipation of large amounts of heat from the transistor to the copper heat sink 26. The pins or terminals may be electrically connected to any suitable external circuit and thus, the construction as described, is fully capable of operating at high current loads without the danger of becoming overheated. The transistor assembly which includes the heat sink 26, mica washer 28 and transistor bar 10 may be employed with or without a casing therefor. If a casing is employed, it can be adapted to aid the heat sink 26 in dissipating heat. Although the heat generated by the transistor bar 10 during the operation thereof is dissipated primarily through the heat sink 26, other metal elements associated with the assembly such as a casing or housing may provide ancillary means for dissipating heat.

Although a mica washer has been described in conjunction with the present invention, it will be appreciated that other means may be employed provided the net result is that the transistor bar is electrically insulated from the header while, at the same time, a good heat transfer relationship exists between the transistor bar and the header. For example, the surface of the header can be coated with a suitable plastic, such as "Teflon" which is a trademark designating a plastic consisting of a tetrafluoroethylene polymer. Another modification applicable to the present invention is the use of "Mylar" of about .003 inch thick in place of the insulating mica washer 28. "Mylar" is a highly durable polyethylene terephthalate resin and is a registered trademark of E. I. du Pont de Nemours & Company of Wilmington, Delaware.

Although the present invention has been shown and described in terms of a single preferred embodiment, nevertheless, various changes and modifications, such as are obvious to one skilled in the art, are deemed to be within the spirit, scope and contemplation of the present invention.

What is claimed is:

1. In a transistor arrangement, a copper heat dissipating element having glass plugs secured therein, a mica insulating washer overlying said heat dissipating element, a junction transistor bar fixed along its long dimension to the surface of said washer remote from said element, and electrical leads extending through said insulating washer and said glass plugs and electrically engaging said transistor bar.

2. In a transistor arrangement, a metallic heat dissipating element having insulating plugs secured therein, an insulating washer overlying said heat dissipating element, a junction transistor bar fixed along its long dimension to the surface of said washer remote from said element, and electrical leads extending through said insulating washer and said insulating plugs and electrically engaging said transistor bar.

3. In a transistor arrangement, a metallic heat dissipating element, an insulating washer overlying said heat dissipating element, a junction transistor bar fixed along its long dimension to the surface of said washer remote from said element, and electrical leads connected to said transistor bar and insulated from said metallic heat dissipating element.

References Cited in the file of this patent

UNITED STATES PATENTS

| | | |
|---|---|---|
| 2,759,133 | Mueller | Aug. 14, 1956 |
| 2,773,224 | Lehovec | Dec. 4, 1956 |
| 2,825,014 | Willemse | Feb. 25, 1958 |